(12) United States Patent
Kim (10) Patent No.: US 7,399,650 B2
(45) Date of Patent: Jul. 15, 2008

(54) WAVELENGTH CONVERTED LIGHT EMITTING APPARATUS USING PHOSPHOR AND MANUFACTURING METHOD THEREOF

(75) Inventor: Hyun Kyung Kim, Kyungki-do (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 381 days.

(21) Appl. No.: 11/195,756

(22) Filed: Aug. 3, 2005

(65) Prior Publication Data

US 2006/0102915 A1 May 18, 2006

Related U.S. Application Data

(62) Division of application No. 10/790,724, filed on Mar. 3, 2004, now abandoned.

(30) Foreign Application Priority Data

Oct. 10, 2003 (KR) ...................... 10-2003-0070716

(51) Int. Cl.
*H01L 21/00* (2006.01)
(52) U.S. Cl. .............. 438/22; 438/26; 438/27
(58) Field of Classification Search .......... 438/22, 438/26, 27
See application file for complete search history.

(56) References Cited

U.S. PATENT DOCUMENTS

| | | | |
|---|---|---|---|
| 6,603,258 B1 * | 8/2003 | Mueller-Mach et al. | 313/501 |
| 6,642,550 B1 * | 11/2003 | Whitworth et al. | 257/99 |
| 6,891,199 B2 * | 5/2005 | Baur et al. | 257/82 |
| 6,911,676 B2 * | 6/2005 | Yoo | 257/93 |
| 7,087,463 B2 * | 8/2006 | Sackrison et al. | 438/113 |
| 7,105,863 B1 * | 9/2006 | Ng et al. | 257/99 |
| 7,151,313 B2 * | 12/2006 | Kondo | 257/741 |
| 7,173,288 B2 * | 2/2007 | Lee et al. | 257/94 |
| 7,279,724 B2 * | 10/2007 | Collins et al. | 257/103 |
| 7,288,797 B2 * | 10/2007 | Deguchi et al. | 257/99 |
| 2002/0028527 A1 | 3/2002 | Maede et al. | |
| 2002/0187571 A1 | 12/2002 | Collins et al. | |
| 2005/0077531 A1 * | 4/2005 | Kim | 257/98 |
| 2005/0184387 A1 * | 8/2005 | Collins et al. | 257/712 |
| 2006/0102915 A1 * | 5/2006 | Kim | 257/98 |
| 2007/0297108 A1 * | 12/2007 | Collins et al. | 361/56 |

FOREIGN PATENT DOCUMENTS

| | | |
|---|---|---|
| JP | 2001-111109 | 4/2001 |
| JP | 2003-34791 | 2/2003 |

* cited by examiner

*Primary Examiner*—Laura M Schillinger
(74) *Attorney, Agent, or Firm*—Lowe Hauptman Ham & Berner (57) ABSTRACT

Disclosed herein is a wavelength converted light emitting apparatus comprising a substrate, a light emitting diode, and a phosphor layer. The substrate is formed at its upper surface with first and second conductive patterns. At a partial region of the first conductive pattern and at the second conductive pattern are formed first and second connection bumps, respectively. The light emitting diode has first and second surfaces opposite to each other, and a side surface. The first surface of the light emitting diode is formed with first and second electrodes. The light emitting diode is disposed at the upper surface of the substrate so that the first and second electrodes are connected to the first and second connection bumps, respectively. The phosphor layer is formed along the second surface and side surface of the light emitting diode by a certain thickness, thereby serving to convert a wavelength of light emitted from the light emitting diode.

8 Claims, 6 Drawing Sheets

PRIOR ART

FIG. 1a

PRIOR ART

WAVELENGTH CONVERTED LIGHT EMITTING APPARATUS USING PHOSPHOR AND MANUFACTURING METHOD THEREOF

RELATED APPLICATIONS

The present application is a divisional application of U.S. patent application No. 10/790,724, filed Mar. 3, 2004 now abandoned.

BACKGROUND OF THE INVENTION

1. Field of the Invention

The present invention relates to a wavelength converted light emitting apparatus, and more particularly to a light emitting apparatus and manufacturing method thereof for producing specific colors of light, such as white light, by converting the wavelength of a portion of the light to be emitted, by making use of phosphors.

2. Description of the Related Art

Semiconductor light emitting diodes are devices having a great potential for miniaturization and good light emission efficiency, and thus they have been utilized as optical sources of various display apparatuses and optical communication equipment. Further, as semiconductor light emitting diodes, which produce blue or ultraviolet light of a short wavelength, have been commercialized in recent years, the semiconductor light emitting diodes can serve to produce white light through the combination of blue, red and green light.

Generally, respective semiconductor light emitting diodes have a feature of emitting single color of light having a predetermined wavelength. Therefore, two typical methods have been used in order to realize emission of white light. One typical method is for integrating two or more kinds of light emitting diodes into a single package, and the other method is for converting a portion of the light emitted from a blue or ultraviolet light emitting device by making use of phosphor, so as to produce white light. Conventionally, the latter method is widely utilized since it is advantageous in view of miniaturization of products.

Figure 1A:
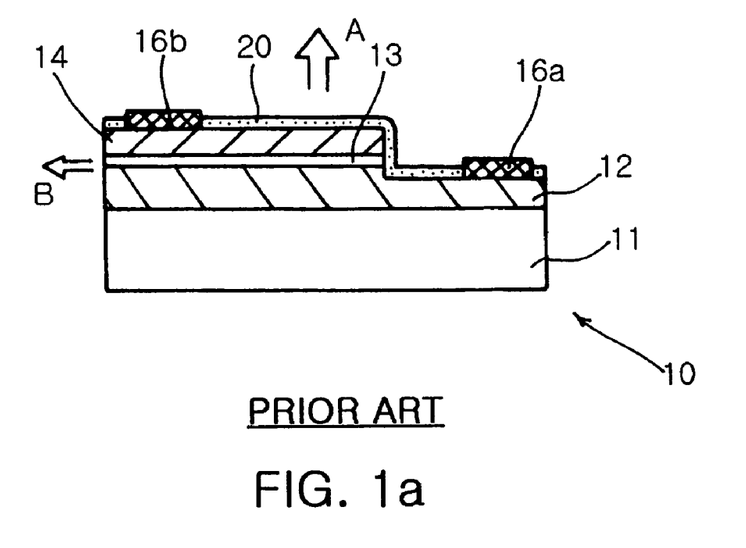
FIGS. 1a and 1b are side sectional views, respectively, illustrating a wavelength converted light emitting diode and light emitting diode package using phosphors in accordance with the prior art.

FIG. 1a illustrates a wavelength converted light emitting diode using phosphor. More particularly, the light emitting diode shown in FIG. 1a may be a light emitting diode 10 adapted to mainly emit white light.

Referring to FIG. 1a, the white light emitting diode 10 comprises a gallium nitride (GaN) based light emitting structure including an n-type GaN clad layer 12, a single quantum well (SQW) or multiple quantum well (MQW) active layer 13, and a p-type GaN clad layer 14, which are successively stacked on a sapphire substrate 11 in multiple layers. This GaN based light emitting structure further includes a first bonding electrode 16a formed on the upper surface of the n-type GaN clad layer 12, and a second electrode 16b formed on the upper surface of the p-type GaN clad layer 14. For the formation of these electrodes, the clad layers are processed by mesa-etching. The white light emitting diode 10 further comprises a phosphor layer 20 provided at the overall upper surface thereof. As used herein, "phosphor" refers to a wavelength convertible material for producing white light. That is, in a state wherein the active layer 13 of the white light emitting diode 10 emits blue or ultraviolet light, most of the emitted blue or ultraviolet light is converted into long wavelength light while passing through the phosphor layer 20. Then, the long wavelength light is combined with the remaining unconverted portion or differently converted portion of the blue or ultraviolet light, thereby allowing desired white light to be finally produced.

Since the conventional white light emitting diode 10 shown in FIG. 1a is manufactured in such a manner that, after the phosphor layer 20 is formed on the overall upper surface of a wafer, which is formed with a plurality of the light emitting diodes, and then the wafer is cut so as to form a plurality of individual chips, the phosphor layer 20 exists only on the upper surface of the white light emitting diode 10.

In this case, upward light A emitted from the upper surface of the white light emitting diode 10 passes through the phosphor layer 20 serving to stimulate the light emitted from the active layer 13 into white light, while lateral light B emitted from the side surface of the white light emitting diode 10 does not pass the phosphor layer 20, thereby being inevitably emitted as the original blue or ultraviolet light itself. As can be well noted from this fact, the light emitting diode 10 shown in FIG. 1a, which is formed only on the upper surface thereof with the phosphor layer 20 due to its manufacturing manner, has a problem in that it is very disadvantageous for the emission of appropriate white light.

Figure 1B:
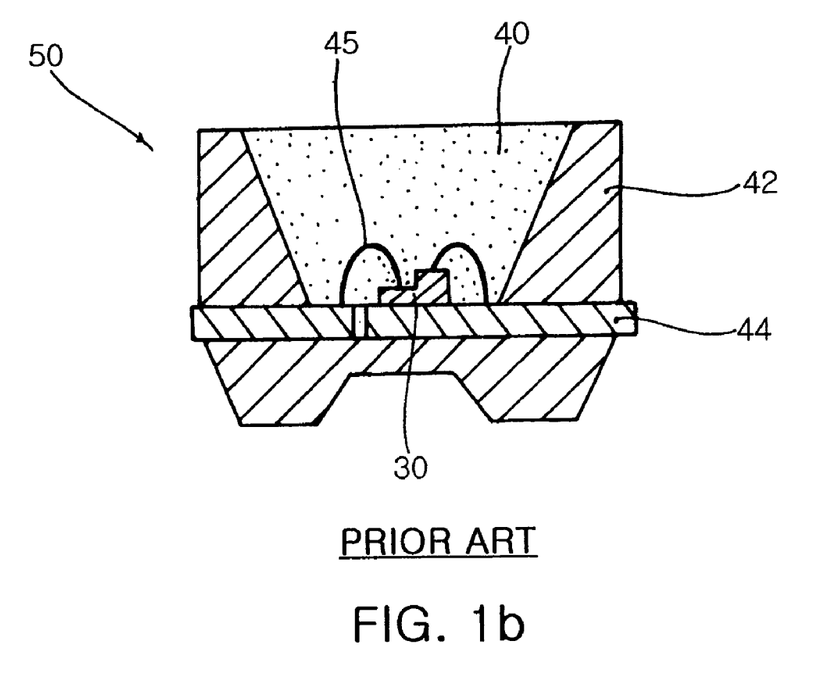

As another example of conventional light emitting diodes, FIG. 1b illustrates the structure of a white light emitting diode using a phosphor material in accordance with the prior art. In FIG. 1b, the phosphor material is added at a package level of the light emitting diode.

Referring to FIG. 1b, the white light emitting diode package, designated as reference numeral 50, comprises a cup shaped package structure 42, which is mounted with a substrate 44 having a first electrode formed thereon. That is, the first electrode is formed on the substrate 44 within the cup shaped package structure 42. On the first electrode is mounted an ultraviolet or blue light emitting diode 30. This light emitting diode 30 is connected to an electrode pattern provided in the cup shaped package structure 42, that is, to a second electrode formed on the substrate 44 through wires 45.

Inside the package structure 42 mounted with the light emitting diode 30 is formed a molded portion 40, which is made of a luminescent material including appropriate phosphor. The phosphor for use in the molded portion 40, for example, may be a yttrium-aluminum-garnet-based luminescent material. Such a luminescent material is obtained by mixing a hardener with an unhardened epoxy resin powder as a main material, thereby producing epoxy slurry. As the epoxy slurry is provided inside the package structure by using a dispensing method, the phosphor molded portion 40 is constructed. Since the phosphor existing inside the molded portion 40 takes the form of scattered phosphor particles, a portion of the light emitted from the light emitting diode collides with the scattered phosphor particles, thereby undergoing wavelength conversion, while the remaining portion of the light directly passes through the molded portion 40 without conversion of wavelength. The combination of the wavelength converted light and other light can appear white to the human eye. The formation method of the phosphor as stated above is further applicable to form the phosphor layer 20 as shown in FIG. 1a.

The phosphor molded portion 40 or the phosphor layer 20, however, results in a non-uniformity in spatial distribution of the phosphor particles scattered therein, and especially, in case of the structure shown in FIG. 1a, the phosphor layer 20 cannot be formed throughout the light emitting surface of the light emitting diode as stated above. Therefore, there is a problem in that it is very difficult to obtain desired colors of light from the overall light emitting surface of the light emitting diode. This problem is a big roadblock to commercialization of the wavelength converted light emitting diodes using phosphors.

Therefore, there has been a requirement of a wavelength converted light emitting diode structure capable of overcoming the above problems in the art.

SUMMARY OF THE INVENTION

Therefore, the present invention has been made in view of the above problems, and it is an object of the present invention to provide a white light emitting apparatus comprising a light emitting diode, which is formed in a flip chip bonding structure so as to allow a phosphor layer to be formed throughout the light emitting surface thereof.

It is another object of the present invention to provide a manufacturing method of a light emitting apparatus of the above-mentioned type.

In accordance with one aspect of the present invention, the above and other objects can be accomplished by the provision of a wavelength converted light emitting apparatus comprising: a substrate having an upper surface formed with first and second conductive patterns, at a partial region of the first conductive pattern and at the second conductive pattern being formed first and second connection bumps, respectively; a light emitting diode having first and second surfaces opposite to each other, and a side surface connected between the first and second surfaces, the first surface being formed with first and second electrodes, the light emitting diode being disposed at the upper surface of the substrate so that the first and second electrodes are connected to the first and second connection bumps, respectively; and a phosphor layer formed along the second surface and side surface of the light emitting diode by a certain thickness, the phosphor layer serving to convert a wavelength of light emitted from the light emitting diode.

Preferably, the light emitting diode may emit ultraviolet or blue light, and the phosphor layer may be a material for converting the light emitted from the light emitting diode into white light.

Preferably, the phosphor layer employed in the present invention may be formed by a physical vapor deposition, chemical vapor deposition, or spin coating method, so as to be precisely formed in an uniform thickness. More preferably, the phosphor layer may be formed by a sputtering method.

Preferably, the light emitting diode may be formed by successively stacking a first conductive semiconductor layer, an active layer, and a second conductive semiconductor layer, on a transparent substrate in multiple layers, the first and second electrodes may be formed on the first and second conductive semiconductor layers, respectively, and a lower surface of the transparent substrate layer may be provided as the second surface of the light emitting diode.

Preferably, the phosphor layer may be formed along the lower surface of the transparent substrate, and along the side surfaces of the first and second conductive semiconductor layers and active layer.

Preferably, the substrate may be a conductive substrate provided with a rear surface electrode, the first conductive pattern may be formed on an insulation layer provided at the conductive substrate, and the second conductive pattern may be formed in a region where the insulation layer is removed so as to be connected with the conductive substrate, thereby being connected to the rear surface electrode.

In accordance with another aspect of the present invention, there is provided a method of manufacturing a wavelength converted light emitting apparatus comprising the steps of: a) preparing a light emitting diode having first and second surfaces opposite to each other, and a side surface connected between the first and second surfaces, the first surface being formed with first and second electrodes; b) preparing a substrate having an upper surface formed with first and second conductive patterns, and forming first and second connection bumps at a partial region of the first conductive pattern and at the second conductive pattern, respectively; c) disposing the light emitting diode at the upper surface of the substrate, and connecting the first and second electrodes of the light emitting diode to the first and second connection bumps, respectively; and d) forming a phosphor layer along the second surface and side surface of the light emitting diode by a certain thickness, the phosphor layer serving to convert a wavelength of light emitted from the light emitting diode.

Preferably, the step d) may include the steps of: d-1) forming a photoresist at a terminal connection region provided on an upper surface of at least one of the first and second conductive patterns, the terminal connection region serving to be connected to an external terminal; d-2) forming the phosphor layer on the substrate on which the light emitting diode is disposed; and d-3) removing the photoresist.

Preferably, the step d-2) may be performed by using one process selected from among a group consisting of physical vapor deposition, chemical vapor deposition, and spin coating method. More preferably, the step d-2) may be performed by a sputtering method.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 2:
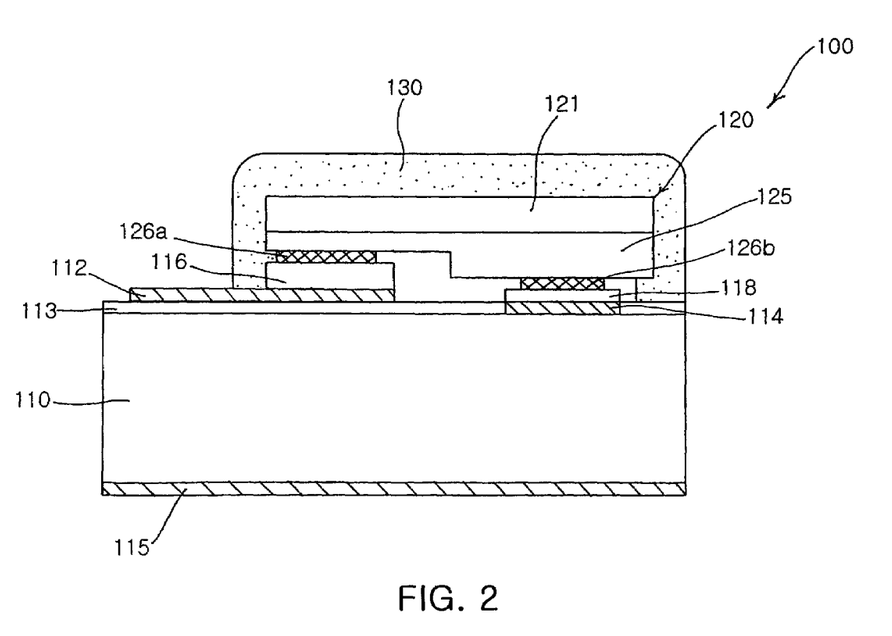
FIG. 2 is a side sectional view illustrating a wavelength converted light emitting apparatus having a flip chip bonding structure in accordance with an embodiment of the present invention.

FIG. 2 is a side sectional view illustrating a light emitting apparatus in accordance with an embodiment of the present invention.

Referring to FIG. 2, the light emitting apparatus, designated as reference numeral 100, comprises a substrate 110, and a light emitting diode 120 provided on the substrate 110 in a flip chip bonding manner. In the present embodiment, the substrate 110 is a conductive silicone substrate, and formed on the upper surface thereof with first and second conductive patterns 112 and 114.

The first conductive pattern 112 is formed on an insulation layer 113, which is formed at the upper surface of the conductive substrate 110 by making use of $SiO_2$. The second conductive pattern 114 is directly formed on the upper surface of the conductive substrate 110. At a partial region of the first conductive pattern 112 and at the second conductive pattern 114 are formed connection bumps 116 and 118, respectively, which are for use in the formation of flip chip bonding. The remaining portion of the first conductive pattern 112, where the connection bump 116 is not formed, serves as a terminal connection region, which will be connected with an external terminal (not shown). The second conductive pattern 114 is connected to a rear surface electrode 115 provided at the lower surface of the substrate 110 through the conductive substrate 110.

The light emitting diode 120 comprises a transparent substrate 121 made of sapphire, and a light emitting structure 125 formed at the transparent substrate 121. The light emitting structure 125 has first and second electrodes 126a and 126b formed to face the same direction, and may be a blue or ultraviolet light emitting diode illustrated in FIG. 1a. That is, the light emitting structure 125 has a mesa type structure consisting of a first conductive GaN-based semiconductor layer, a multiple quantum well GaN/InGaN-based active layer, and a second conductive GaN-based semiconductor layer. The first and second electrodes 126a and 126b are formed on the first and second conductive semiconductor layers, respectively, thereby enabling them to face the same direction.

The light emitting diode 120 structured as stated above is mounted on the substrate 110 in a flip chip bonding manner. More particularly, the light emitting diode 120 is disposed on the upper surface of the conductive substrate 110 so that the first and second electrodes 126a and 126b are connected to the first and second connection bumps 116 and 118, respectively, which are in turn formed at the first and second conductive patterns 112 and 114. The first and second connection bumps 116 and 118 are means for connecting the first and second electrodes 126a and 126b to desired positions of the first and second conductive patterns 112 and 114, and fixing them at the desired positions, respectively. The connection bumps can be made of common metals well known in the art, such as Au, Pb/Sn, Au/Sn, Au/Ge, Au/Sn/Ge, Au/Pb/Sn or Cu/Pb/Sn.

In the light emitting apparatus 100 comprising the light emitting diode 120 mounted thereto in a flip-chip bonding manner, light emitted from the light emitting diode 120 is mainly discharged from a second surface of the light emitting diode 120, that is, one surface of the transparent substrate 121 opposite to a first surface of the light emitting diode 120 formed with the first and second electrodes 126a and 126b. Further, a great portion of the light is discharged through the side surface of the light emitting diode 120. Therefore, the light emitting apparatus 100 in accordance with the present invention is formed to have a phosphor layer 130 throughout the light emitting surface of the light emitting diode 120 in a uniform thickness. The phosphor layer is made of any luminescent material for converting the wavelength of ultraviolet or blue light, thereby achieving white light.

By virtue of the fact that the phosphor layer 130 is formed throughout the second surface, as an essential light emitting surface, and the side surface of the light emitting diode 120 so that substantially all light passes the phosphor layer 130, the light emitting apparatus 100 of the present invention can improve its conversion efficiency into white light. A conventional dispensing process for mixing phosphor powder and epoxy resin, and spraying and hardening the resulting mixture inevitably causes a non-uniformity in spatial distribution of phosphor particles. In order to solve this non-uniformity problem, the phosphor layer of the present invention can be formed by a sputtering method. Alternatively, the phosphor layer can be formed by one selected from among physical vapor deposition, chemical vapor deposition, and spin coating methods. By using these methods, it is possible to precisely form the phosphor layer 130 with a uniform thickness. Therefore, a conventional problem of applying the phosphor layer by an excessive thickness can be solved, thereby preventing the generation of sparsely applied portions, which generally appear in the conventional dispensing method.

As can be seen from FIG. 2, the phosphor layer 130 can be formed to reach the upper surface of the conductive substrate 110 in order to sufficiently cover the light emitting surface of the light emitting diode 120. In this case, the second conductive pattern 114 of the present embodiment is connected to the rear surface electrode 115 through the conductive substrate 110, and the rear surface electrode 115 serves as a terminal connection region, which will be connected to the outside, while the first conductive pattern 112 has to define a certain region on the upper surface thereof for allowing it to serve as a terminal connection region capable of being connected to the outside through a wire (not shown). Therefore, the certain partial region of the first conductive pattern 112 is not formed with the phosphor layer 130.

FIGS. 3a to 3f are sectional views illustrating the sequential steps of manufacturing the wavelength converted light emitting apparatus having a flip chip bonding structure in accordance with the present invention. The present embodiment shows a manufacturing method of the light emitting apparatus having a flip chip bonding structure at a wafer level.

Figure 3A:
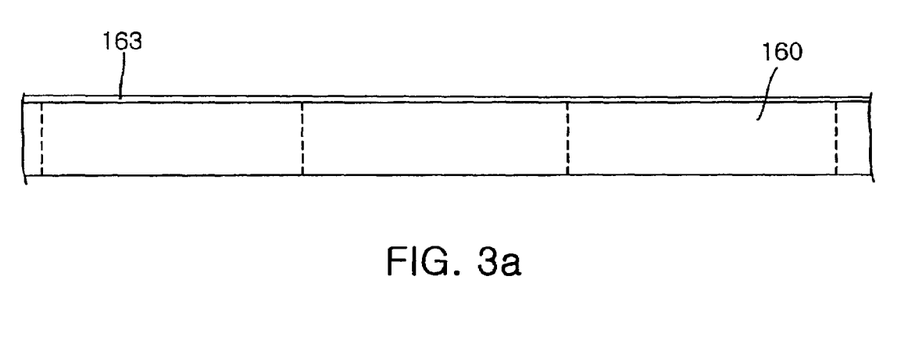
FIGS. 3a to 3f are sectional views illustrating the sequential steps of manufacturing the wavelength converted light emitting apparatus having a flip chip bonding structure in accordance with the present invention.

As shown in FIG. 3a, the manufacturing method of the wavelength converted light emitting apparatus in accordance with the present invention begins with the step of preparing a wafer 160, which is formed at the upper surface thereof with an insulation layer 163. The wafer 160 is a conductive silicone substrate, and is for use as a substrate for allowing flip chip bonding of individual chip type light emitting diodes. In general, a silicone wafer can be used as the wafer 160. In FIG. 3a, each region sectionalized by dotted lines shows a region corresponding to a light emitting apparatus.

Figure 3B:
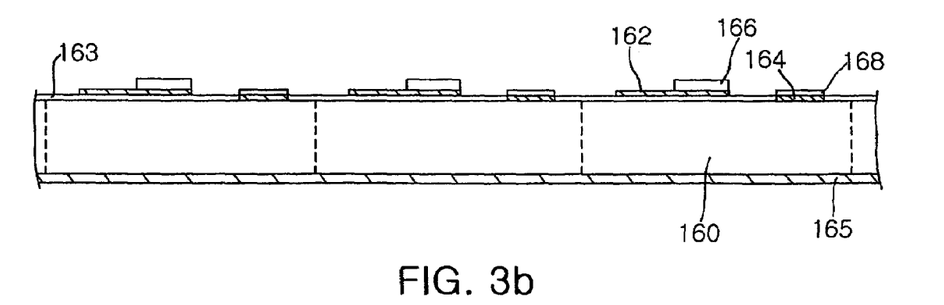

At the respective regions of the wafer 160, subsequently, are formed a wiring structure for forming a flip chip bonded light emitting apparatus, respectively. As shown in FIG. 3b, the insulation layer 163 provided on the upper surface of the wafer 160 is formed thereon with first conductive patterns 162. Differently from the first conductive patterns 162, second conductive patterns 164 are directly formed on the upper surface of the wafer 160 as a conductive substrate after etching partial regions of the insulation layer 163. Such direct formation of the second conductive patterns on the wafer is for allowing connection terminals, which will be connected to the outside, to be formed at the lower surface of the wafer 160. Then, the wafer 160 as a conductive substrate is formed at the lower surface thereof with rear surface electrodes 165. Further, at a partial region of each first conductive pattern 162 and at each second conductive pattern 164 are formed connection bumps 166 and 168, respectively, which are for use in the mounting of light emitting diodes on the conductive patterns. The connection bumps 166 and 168, as stated above, can be formed by using common metals well known in the art, such as Au, Pb/Sn, Au/Sn, Au/Ge, Au/Sn/Ge, Au/Pb/Sn, or Cu/Pb/Sn.

Figure 3C:
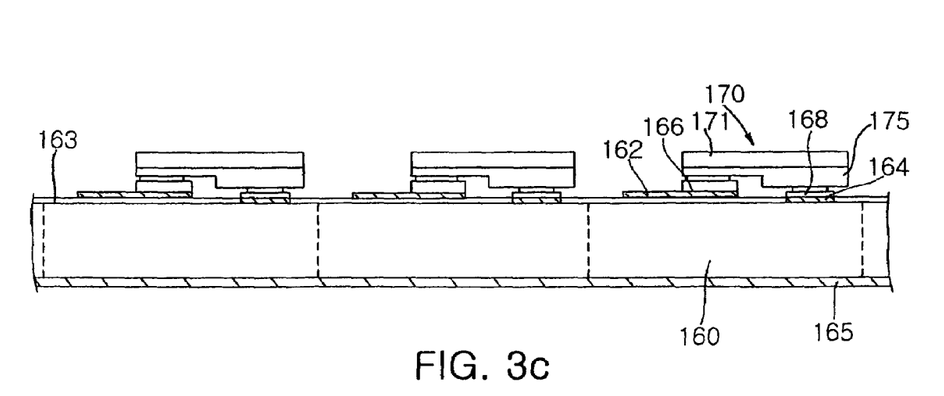

In the next step, as shown in FIG. 3c, a plurality of light emitting diodes 170 are mounted at individual regions of the wafer 160, respectively. The light emitting diodes 170 have a first surface formed with first and second electrodes 176a and 176b, and a second surface opposite to the first surface. The light emitting diodes 170 can include a transparent substrate 171 such as a sapphire substrate, and have a PN bonded light emitting structure 175 of a mesa shape wherein a first conductive semiconductor layer, an active layer and a second conductive semiconductor layer are successively stacked thereon in multiple layers. The light emitting diodes 170 are mounted on the wafer 160 in such a fashion that their first surfaces face downward, and the first and second electrodes 176a and 176b thereof are connected and fixed to the first and second conductive patterns 162 and 164 by using the previously prepared connection bumps 166 and 168, respectively, resulting in a desired flip chip bonding structure.

After completing the mounting of the light emitting diodes 170, the overall light emitting surface of the respective light emitting diodes 170 are formed with a phosphor layer 180 having a uniform thickness. In the respective light emitting diodes 170 flip chip bonded as shown in FIG. 3c, the light emitting surface thereof includes the second surface of the light emitting diode 170 coming into contact with the transparent substrate, and the side surface thereof. The present embodiment utilizes a vapor deposition method in order to precisely form the phosphor layer in a uniform thickness. FIGS. 3a to 3e illustrate the sequential steps of forming the phosphor layer on the light emitting surface in accordance with the present invention. The formation process of the phosphor layer employed in the present invention begins with the step of forming a photoresist pattern at a partial region of the upper surface of at least one of the first and second conductive patterns.

Figure 3D:
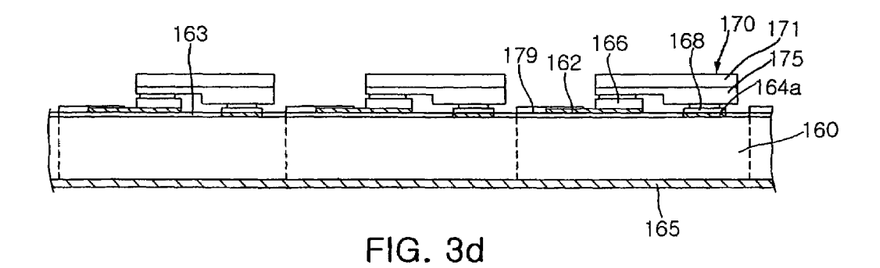

In the present embodiment, as shown in FIG. 3d, the first conductive patterns 162 are formed with photoresist patterns 179 at partial side regions serving as a terminal connection region, respectively. The photoresist patterns 179 function to allow the conductive patterns 162 to be connected to external terminals through the terminal connection regions. The second conductive patterns 164 generally define such terminal connection regions through the rear surface electrodes 166. In case that the second conductive patterns 164 are formed only on the upper surface of the wafer 160 like the first conductive patterns 162, since a partial region of the respective first conductive patterns 162 serves as a terminal connection region to be connected to the outside through a wire, the photoresist patterns 179 are formed so that they are not formed with a phosphor layer during performing a subsequent vapor deposition method.

Figure 3E:
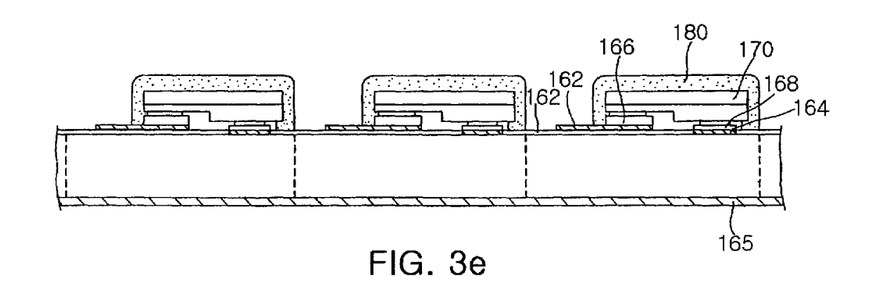

Subsequent to the formation of the photoresist patterns 179, the wafer 160, on which the light emitting diodes 170 are mounted, is formed with a phosphor layer 180 by using a sputtering, physical vapor deposition, chemical vapor deposition, or spin coating method, and then the photoresist patterns 179 are removed. As a result, as shown in FIG. 3e, it is possible to form the phosphor layer throughout the second surface and side surface, as the light emitting surface, of the respective light emitting diodes. The phosphor layer obtained according to the present formation process can be formed so as to reach the upper surface of the wafer and a partial region of the conductive patterns, in order to sufficiently cover the side region of the light emitting diodes. The phosphor layer can be formed at desired regions by adjusting the position of the photoresist patterns shown in FIG. 3d. In order to precisely form the phosphor layer having a uniform thickness, a sputtering, physical vapor deposition, chemical vapor deposition, or spin coating method can be utilized.

Figure 3F:
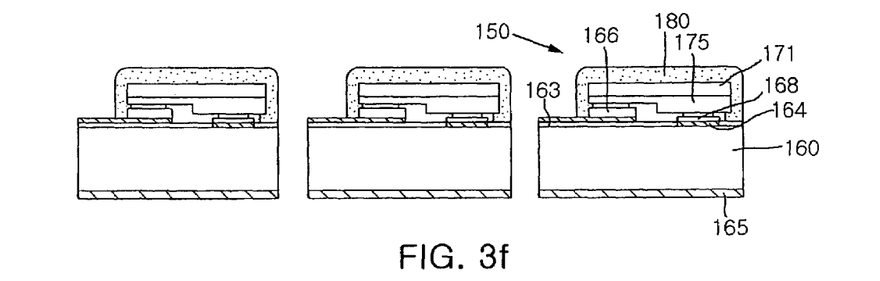

By cutting the resulting wafer depicted in FIG. 3e by predetermined distances, finally, it is possible to achieve a desired wavelength converted light emitting apparatus as shown in FIG. 3f. The wavelength converted light emitting apparatus is mainly used as a white light emitting apparatus. In this case, its light emitting diode may be a light emitting diode producing short wavelength ultraviolet or blue light, and the phosphor layer can be made of an appropriate luminescent material, which can produce white light by converting such short wavelength light. The light emitting apparatus shown in FIG. 3f can be manufactured to have a package form shown in FIGS. 5a and 5b. This will be explained hereinafter.

As stated above, the light emitting apparatus according to the present invention can achieve good wavelength conversion efficiency by forming the phosphor layer throughout the light emitting surface, that is, the side surface and second surface of the light emitting diode. Further, by virtue of the fact that the phosphor layer is formed by using a vapor deposition method, it is possible to precisely form the phosphor layer having a uniform thickness.

Figure 4:
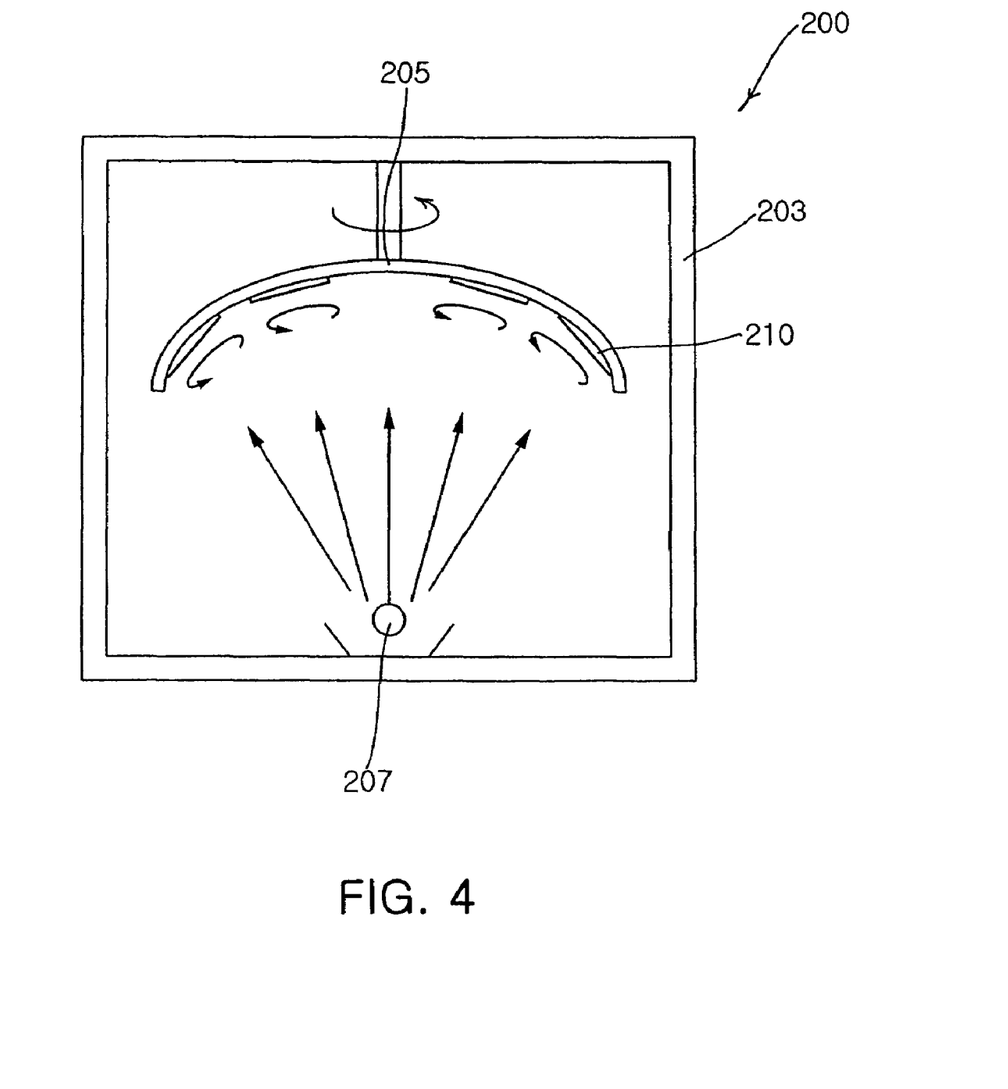
FIG. 4 is a schematic sectional view illustrating one example of a sputtering apparatus, which is for use in the formation process of a phosphor layer in accordance with the present invention.

In relation to the phosphor layer, the present invention can use a vapor deposition apparatus suitable for improving step coverage of the phosphor layer in order to achieve a more uniform thickness. FIG. 4 is a schematic sectional view illustrating one example of a sputtering apparatus, which is for use in the formation process of the phosphor layer in accordance with the present invention.

Referring to FIG. 4, the sputtering apparatus 200 can be defined by a vacuum chamber, in which a phosphor source 207 and a rotatable support 205 are mounted. The support 205 takes a semi-spherical structure so as to allow a mounted wafer and the phosphor source 207 to form a certain inclination angle. For achieving improvement of step coverage, the sputtering apparatus 200 is constructed so that the mounted wafer as well as the support itself are rotatable. By performing a vapor deposition method with the sputtering apparatus constructed as stated above, it is possible to form the phosphor layer having a substantially uniform thickness throughout the second surface and side surface of the light emitting diode, which is mounted on the wafer in a flip chip bonding manner. The sputtering apparatus shown in FIG. 4 is given only as an example, and the present invention can preferably use other vapor deposition apparatuses or methods well known in the art for achieving improvement of step coverage.

Figure 5:
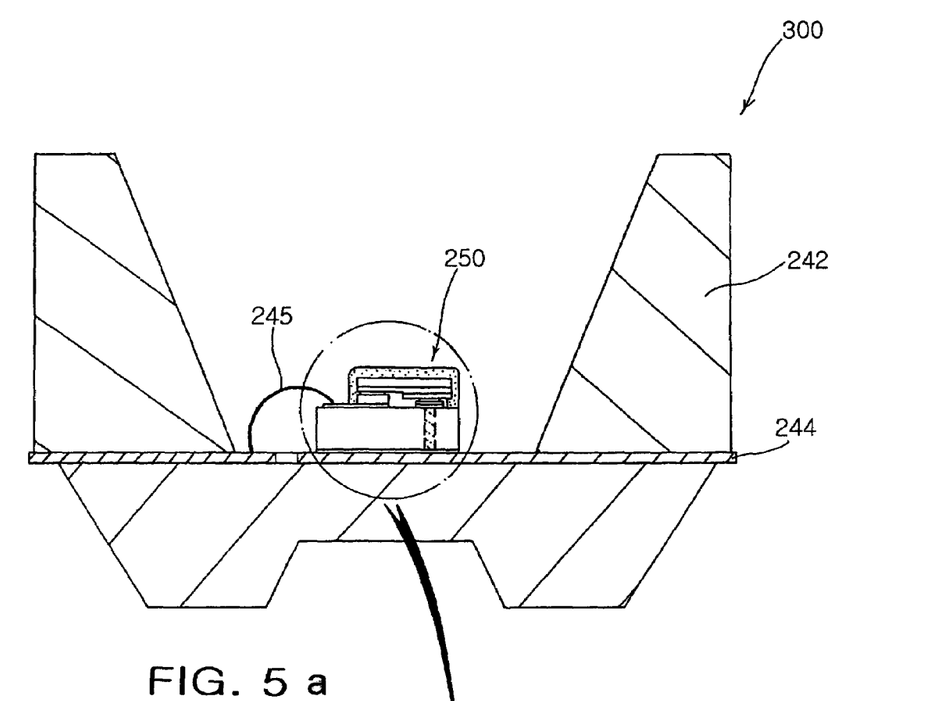
FIGS. 5a and 5b are side sectional views illustrating a package containing a wavelength converted light emitting apparatus in accordance with the present invention.

FIGS. 5a and 5b are side sectional views illustrating a package containing the wavelength converted light emitting apparatus in accordance with the present invention.

As shown in FIGS. 5a and 5b, the light emitting apparatus of the present invention can be manufactured to have a package form similar to that shown in FIG. 1b. Referring to FIGS. 5a and 5b, the package, designated as reference numeral 300, employing the light emitting apparatus of the present invention comprises a cup shaped package structure 242. To the package structure 242 is mounted a package substrate 244, on which first and second lead frames (not shown) are provided at separated different regions, respectively. At a certain region of the substrate 244 connected to the second lead frame is mounted a light emitting apparatus 250, which is further connected to the remaining region of the substrate 244 connected to the first lead frame through a wire 245.

In this way, a light emitting diode 230 provided in the light emitting apparatus comprises a first electrode 236a, which can be connected to the second lead frame (not shown) through a first conductive pattern 222 and the wire 245, and a second electrode 236b, which can be electrically connected to the first lead frame (not shown) provided at the package substrate 244 through a second conductive pattern 224, conductive substrate 220, and rear surface electrode 225. In such a connection structure, when a certain driving voltage is applied to the first and second lead frames, an active layer 233 of the light emitting diode 230 produces ultraviolet or blue light of a short wavelength, and the produced light is converted through a phosphor layer 240 surrounding the overall light emitting surface of the light emitting diode, thereby producing white light.

In the present invention, especially, the electrical connection structure, defined on the conductive substrate for flip chip bonding, can be variously changed, and its defining process can be embodied differently from that shown in FIGS. 5a and 5b. That is, instead of using the conductive substrate, the first and second conductive patterns are formed on the upper surface of a nonconductive substrate, and then only the second conductive pattern is connected to the rear surface electrode through a conductive via hole. Further, instead of previously forming the insulation layer on the upper surface of the wafer, the insulation layer can be formed after forming the second conductive pattern.

As apparent from the above description, the present invention provides a light emitting apparatus, which is configured in such a fashion that a light emitting diode is mounted on a substrate in a flip chip bonding manner, and a phosphor layer is formed throughout the light emitting surface of the light emitting diode, resulting in an improved light wavelength conversion efficiency. Further, according to the present invention, it is possible to precisely form the phosphor layer having a uniform thickness by using a vapor deposition method, thereby eliminating a non-uniformity in spatial distribution of phosphor particles caused in a dispensing process.

Although the preferred embodiment of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a wavelength converted light emitting apparatus comprising the steps of:
   a) preparing a light emitting diode having first and second surfaces opposite to each other, and a side surface connected between the first and second surfaces, the first surface being formed with first and second electrodes;
   b) preparing a substrate having an upper surface formed with first and second conductive patterns, and forming first and second connection bumps at a partial region of the first conductive pattern and at the second conductive pattern, respectively;
   c) disposing the light emitting diode at the upper surface of the substrate, and connecting the first and second electrodes of the light emitting diode to the first and second connection bumps, respectively; and
   d) forming a phosphor layer along the second surface and side surface of the light emitting diode by a certain thickness, the phosphor layer serving to convert a wavelength of light emitted from the light emitting diode;
   wherein the step b) includes the steps of:
   b-1) preparing the conductive substrate;
   b-2) forming an insulation layer on the upper surface of the conductive substrate;
   b-3) forming the first and second conductive patterns;
   b-4) forming a rear surface electrode at a lower surface of the conductive substrate; and
   b-5) forming the first and second connection bumps at the partial region of the first conductive pattern and at the second conductive pattern, respectively,
   wherein the step b-3) includes the steps of:
   b-3-1) forming the first conductive pattern on the insulation layer; and b-3-2) forming the second conductive pattern at a region of the upper surface of the conductive substrate, the region being exposed to the outside by removing a corresponding partial region of the insulation layer.

2. The method as set forth in claim 1, wherein: the light emitting diode emits ultraviolet or blue light; and
   the phosphor layer is a material for converting the light emitted from the light emitting diode into white light.

3. The method as set forth in claim 1, wherein the step d) is the step of forming the phosphor layer so that the phosphor layer extends along the second surface and side surface of the light emitting diode, and reaches the upper surface of the substrate extending from the side surface of the light emitting diode.

4. The method as set forth in claim 1, wherein the step d) includes the steps of:
   d-1) forming a photoresist at a terminal connection region provided on an upper surface of at least one of the first and second conductive patterns, the terminal connection region being connected to an external terminal;
   d-2) forming the phosphor layer on the substrate on which the light emitting diode is disposed; and
   d-3) removing the photoresist.

5. The method as set forth in claim 4, wherein the step d-2) is performed by using one process selected from among a group consisting of physical vapor deposition, chemical vapor deposition, and spin coating methods.

6. The method as set forth in claim 4, wherein the step d-2) is performed by a sputtering method.

7. The method as set forth in claim 1, wherein: the light emitting diode is formed by successively stacking a first conductive semiconductor layer, an active layer, and a second conductive semiconductor layer on a transparent substrate in multiple layers;
   the first and second electrodes are formed on the first and second conductive semiconductor layers, respectively; and
   one surface of the transparent substrate opposite to the surface formed with the first conductive semiconductor layer is provided as the second surface of the light emitting diode.

8. The method as set forth in claim 7, wherein the step d) is the step of forming the phosphor layer along one surface of the transparent substrate provided as the second surface of the light emitting diode, and along the side surfaces of the transparent substrate, the first and second conductive semiconductor layers and active layer, by a certain thickness.

* * * * *